United States Patent [19]

Guilinger et al.

[11] Patent Number: 4,995,954

[45] Date of Patent: Feb. 26, 1991

[54] POROUS SILICONFORMATION AND ETCHING PROCESS FOR USE IN SILICON MICROMACHINING

[75] Inventors: Terry R. Guilinger; Michael J. Kelly; Samuel B. Martin, Jr.; Joel O. Stevenson; Sylvia S. Tsao, all of Albuquerque, N. Mex.

[73] Assignee: The United States of America as represented by the Department of Energy, Washington, D.C.

[21] Appl. No.: 478,376

[22] Filed: Feb. 12, 1990

[51] Int. Cl.⁵ .............................................. C25F 3/12
[52] U.S. Cl. .............................................. 204/129.75
[58] Field of Search ................................... 204/129.75

[56] References Cited

PUBLICATIONS

"Fabrication of Silicon Microstructures Based on Selective Formation and Etching of Porous Silicon", *Journal Electrochemical Society*, vol. 135, No. 8, Aug. 1988, pp. 2105-2107.

J. Benjamin, "Micromachining of Silicon by Selective Anodisation", *Silicon Based Sensors*, Mtg. of Instrument Science and Technology Group of the Institute of Physics, Briston, Eng., 1986, pp. 23-43.

Primary Examiner—Tufariello T. M.
Attorney, Agent, or Firm—Armand McMillan; James H. Chafin; William R. Moser

[57] ABSTRACT

A reproducible process for uniformly etching silicon from a series of micromechanical structures used in electrical devices and the like includes providing a micromechanical structure having a silicon layer with defined areas for removal thereon and an electrochemical cell containing an aqueous hydrofluoric acid electrolyte. The micromechanical structure is submerged in the electrochemical cell and the defined areas of the silicon layer thereon are anodically biased by passing a current through the electrochemical cell for a time period sufficient to cause the defined areas of the silicon layer to become porous. The formation of the depth of the porous silicon is regulated by controlling the amount of current passing through the electrochemical cell. The micromechanical structure is then removed from the electrochemical cell and submerged in a hydroxide solution to remove the porous silicon. The process is subsequently repeated for each of the series of micromechanical structures to achieve a reproducibility better than 0.3%.

8 Claims, 1 Drawing Sheet

POROUS SILICON FORMATION AND ETCHING PROCESS FOR USE IN SILICON MICROMACHINING

FIELD AND HISTORICAL BACKGROUND OF THE INVENTION

The present invention is directed to a reproducible process for uniformly etching silicon from a series of micromechanical structures used in electrical devices and the like, and more particularly to a process for forming and etching porous silicon from micromechanical structures. The Government has rights in this invention pursuant to Contract No. DE-AC04-76DP00789 awarded by the U.S. Department of Energy to AT&T Technologies, Inc.

Silicon is known to have exceptional mechanical, thermal and electrical properties. The use of single crystal silicon in fabricating a great diversity of micromechanical devices, such as pressure and vibration sensors and accelerometers, is known by utilizing the silicon patterning and etching technologies. Many of these devices require structures that often have complex and elaborate geometry. In order to make structures of complex geometry, the silicon must be patterned not only in the plane of the surface, but also in a vertical dimension. The patterning in the plane of the surface of a wafer, for example, can be easily done by conventional photolithography and etching processes.

Conventional silicon removal technology includes chemical etching of silicon in hydroxide baths at elevated temperatures. However, precise control of the amount of silicon to be removed is difficult with chemical etching techniques due to the strong etch rate dependence on the temperature and bath composition. Moreover, chemical etching tends to result in an etched area with a matte rather than the preferred mirror finish. Furthermore, chemical etching results in etches along crystallographic directions.

Another known etching process uses anodic dissolution of silicon in hydrofluoric acid. At high anodic biases, the silicon is known to electropolish. Although electropolishing technique would provide beneficial results, the process is nevertheless deficient and requires removal of all the silicon in the electrochemical step.

Accordingly, there remains a need in the art for a silicon etching technique that does not suffer from the disadvantages associated with the conventional etching methods.

OBJECTS AND SUMMARY OF THE INVENTION

The principal object of the present invention is to provide a reproducible process for uniformly etching silicon from various structures, such as wafers, in the fabrication of micromechanical devices and the like.

Another object of the present invention is to provide a process for etching silicon which can be used to precisely control the rate and depth of silicon removal from micromechanical structures.

Yet another object of the present invention is to provide a process for etching silicon which produces an etched area having a mirror finish substantially identical to the mirror finish of the original wafer surface.

A further object of the present invention is to provide a process for etching silicon which has a more rapid etching rate than the electropolishing technique for a given electric charge passed through an electrochemical cell.

Yet a further object of the present invention is to provide a process for etching silicon in which it is not necessary to remove all silicon in the electrochemical step.

An additional object of the present invention is to provide a process for etching silicon which substantially eliminates waste and scrapping of micromechanical structures.

Yet an additional object of the present invention is to provide a process for etching silicon which substantially eliminates the need for inspecting a large number of micromechanical structures in order to obtain uniformity.

In summary, the object of the present invention is to provide an improved process for etching silicon when fabricating various micromechanical devices.

BRIEF DESCRIPTION OF THE DRAWINGS

The above and other objects and advantages and novel features of the present invention will become apparent from the following detailed description of the preferred embodiment of the invention illustrated in the accompanying drawings, wherein.

DETAILED DESCRIPTION OF THE INVENTION

Figure 1:
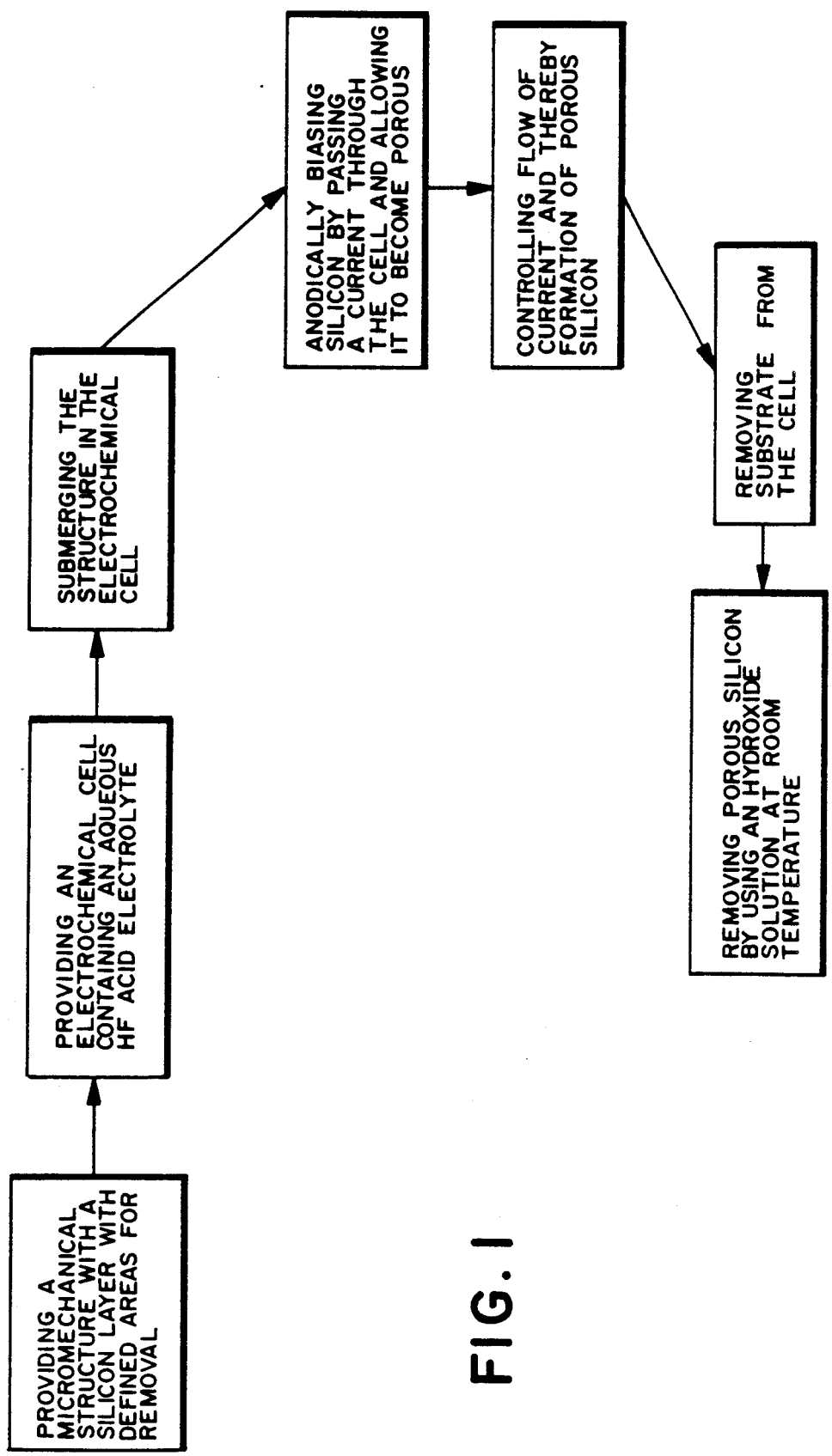
FIG. 1 is a flow chart of the process of the present invention.

As illustrated in FIG. 1, the process of the present invention generally includes selectively forming porous silicon in the silicon layer present on a micromechanical structure by anodically biasing the silicon layer in an electrochemical cell containing an aqueous hydrofluoric acid electrolyte. In this step, the anodic bias is controlled in a region below the conventional electropolishing technology to make the silicon porous. The second and final major step includes chemical etching of the porous silicon using hydroxide solutions at room temperature, while leaving the non-porous silicon intact.

By using an electrochemical technique to define or map the etched area, it is possible to more precisely control the etching rate of the silicon since etching only occurs where the anodic charge is applied. Further, since the etching rate is directly proportional to the current passed in the electrochemical cell, the depth of porous silicon formation can be easily regulated by controlling the total charge passed through the electrochemical cell.

Typically, a micromechanical structure having a silicon layer with defined or mapped areas for silicon removal is provided. The micromechanical structure is then submerged in a electrochemical cell containing an aqueous hydrofluoric acid electrolyte. The silicon layer is anodically biased only in the defined areas for silicon removal by passing a current through the electrochemical cell for a time period sufficient to cause the silicon in the defined areas to become porous. The depth of the porous silicon formation is easily regulated by controlling the total charge passed through the cell. The micromechanical structure containing porous silicon in the defined areas is removed from the cell and submerged in a hydroxide solution to remove the porous silicon. The process can subsequently be repeated for a series of micromechanical structures to achieve a reproducibility better than about ±0.3%.

As an illustration of the process of the invention, a 0.008–0.020 ohm—cm. resistivity n-type (100) orientation silicon was used. The surface of the silicon was patterned such that silicon nitride covered the entire surface, except for a 0.25×0.25 in. sq. area in the center of the wafer. The silicon wafer was then mounted in an electrochemical cell containing equal volumes of 49 weight percent hydrofluoric acid and absolute ethanol. The silicon was anodically biased at current densities ranging from about 30 to about 130 mA/cm$^2$ for time intervals between about 25 and about 255 minutes. After anodization, the wafer was removed from the electrochemical cell and porous silicon was etched for 5–20 minutes by submerging the wafer in a 7M sodium hydroxide solution.

The observation of the etched region showed it to have a mirror finish nearly identical to that of the original silicon wafer surface. In ten trials under the same conditions at a current density of about 80mA/cm.$^2$, etch depths between about 18.5 and 19.2 mils, yielding an average depth of 18.8±0.3 mils or a reproducibility of ±1.6% was obtained. In repeated trials, under the same conditions, at a current density of about 130 mA/cm$^2$, the etch depths of 9.2, 9.4 and 9.4 mils, yielding an average depth of 9.3±0.1 mils or a reproducibility of ±1.1% was obtained. Other trials achieved a reproducibility better than 0.3%.

It should be noted that the disclosed process is superior to the conventional electropolishing technique. At lower anodic biases, the silicon was found to become porous rather than electropolish. Etching, using porous silicon, has the same advantages as electropolishing in terms of etch rate control and side wall orientation with the silicon surface. However, porous silicon etching offers two distinct advantages over electropolishing. First, the formation of porous silicon is essentially a two electron transfer compared to the four electron transfer required for electropolishing. This results in an etching rate which is more rapid by a factor of two for porous silicon than for electropolishing when the two processes are operated for the same number of coulombs passed through the electrochemical cell. Second, it is not necessary to remove all the silicon in the electrochemical step when using porous silicon. For example, if only 50% of the silicon is removed in the electrochemical step using porous silicon, the etch depth using porous silicon is twice that of the etch depth using electropolishing for the same number of coulombs passed through the electrochemical cell. The porous silicon which remains after the electrochemical step is rapidly removed in the present invention by using a hydroxide solution at room temperature. For example, to etch 6 mil of 50% dense porous silicon takes only 5–10 minutes.

By using the present process, it is possible to precisely control the depth of porous silicon and its rate of formation for silicon layers having thicknesses of about 500 microns and more.

While this invention has been described as having a preferred method, it is understood that it is capable of further modifications, uses and/ or adaptations of the invention and following in general the principles of the invention and including such departures from the present disclosure as come within known or customary practice in the art to which the present invention pertains, and as may be applied to essential features hereinbefore set forth, and fall within the scope of the invention or the limits of the claims appended hereto.

What is claimed is:

1. A reproducible process for uniformly etching silicon from a series of micromechanical structures used in electrical devices comprising the steps of
   (a) providing a micromechanical structure having a silicon layer with defined areas for removal thereon;
   (b) providing an electrochemical cell containing an aqueous hydrofluoric acid electrolyte;
   (c) submerging said micromechanical structure in said electrochemical cell;
   (d) anodically biasing said defined areas of said silicon layer by passing a current through said electrochemical cell for a time period sufficient to cause said defined areas of said silicon layer to become porous;
   (e) regulating the depth of formation of said porous silicon by controlling the total charge passed through said electrochemical cell;
   (f) removing said micromechanical structure from said electrochemical cell and then submerging said micromechanical structure in a hydroxide solution to remove said porous silicon; and
   (g) subsequently repeating the process for each of said series of micromechanical structures to achieve a reproducibility better than ±0.3%.

2. The process of claim 1, including the step of:
   (a) providing an electrochemical cell containing equal volumes of about 49% by weight of aqueous hydrofluoric acid electrolyte and absolute ethanol.

3. The process of claim 2, including the step of:
   (a) anodically biasing said silicon layer at current densities ranging from about 30 to about 130 mA/cm$^2$.

4. The process of claim 1, including the step of:
   (a) passing a current through said electrochemical cell for a time period ranging up to about 255 minutes.

5. The process of claim 1, including the step of:
   (a) removing said porous silicon by submerging said micromechanical structure in a hydroxide solution at room temperature.

6. The process of claim 1, including the step of:
   (a) removing said porous silicon by submerging said micromechanical structure in a hydroxide solution for a time period ranging from about 5 to about 20 minutes.

7. The process of claim 1, including the step of:
   (a) removing said porous silicon by submerging said micromechanical structure in a sodium hydroxide solution having a molarity of about 7.0.

8. The process of claim 1, including the step of:
   (a) removing said porous silicon from said micromechanical structure to produce said defined areas having mirror finishes substantially identical to the mirror finish of the surface of said micromechanical structure.

* * * * *